(12) United States Patent
Ng et al.

(10) Patent No.: US 10,133,405 B2
(45) Date of Patent: Nov. 20, 2018

(54) RECONFIGURABLE TOUCH SENSING FOR TOUCH-DISPLAY PANEL

(71) Applicant: Solomon Systech (Shenzhen) Limited, Nanshan Shenzhen (CN)

(72) Inventors: Sing Ng, Hong Kong (HK); Wing Chi Stephen Chan, Hong Kong (HK); Hon Sheung Liu, Hong Kong (HK); Xiacong Liu, Hong Kong (HK); Siu Hong Lui, Hong Kong (HK)

(73) Assignee: Solomon Systech (Shenzhen) Limited, Nanshan Shenzhen (CN)

( * ) Notice: Subject to any disclaimer, the term of this patent is extended or adjusted under 35 U.S.C. 154(b) by 151 days.

(21) Appl. No.: 15/349,972

(22) Filed: Nov. 11, 2016

(65) Prior Publication Data

US 2018/0136775 A1    May 17, 2018

(51) Int. Cl.
| | |
|---|---|
| *G06F 3/0488* | (2013.01) |
| *G06F 3/041* | (2006.01) |
| *G06F 3/044* | (2006.01) |
| *H01L 27/32* | (2006.01) |
| *H04L 5/22* | (2006.01) |

(52) U.S. Cl.
CPC ............ *G06F 3/0416* (2013.01); *G06F 3/044* (2013.01); *G06F 3/0412* (2013.01); *G06F 3/04886* (2013.01); *H01L 27/323* (2013.01); *H01L 27/3288* (2013.01); *H04L 5/22* (2013.01)

(58) Field of Classification Search
None
See application file for complete search history.

(56) References Cited

U.S. PATENT DOCUMENTS

2012/0105355 A1*  5/2012  Souchkov ............ G06F 3/0416
                                                                    345/174

* cited by examiner

*Primary Examiner* — Gustavo Polo
(74) *Attorney, Agent, or Firm* — Spruson & Ferguson (Hong Kong) Limited (57) ABSTRACT

A touch-sensing-enabled display module is provided. In the module, a display panel has an electroluminescent layer, such as an organic light emitting diode (OLED) layer, sandwiched between cathode electrodes and anode electrodes. The anode electrodes transmit touch-sensing signals induced at the display panel. The MSN performs multiplexing and summing on the touch-sensing signals to produce output-channel signals for touch sensing. The multiplexing and the summing are reconfigurable such that the touch-sensing signals are dynamically selected for summing to produce one or more output-channel signals. A touch controller measures the output-channel signals to generate touch data. The module further includes a display driver for driving the cathode and anode electrodes. By using the MSN, the display panel is able to provide adaptive sensor reconfiguration. One particular advantage of adaptive sensor reconfiguration is that the signal-to-noise ratio of a touch signal is improved, increasing accuracy in touch detection.

9 Claims, 13 Drawing Sheets

RECONFIGURABLE TOUCH SENSING FOR TOUCH-DISPLAY PANEL

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This present invention generally relates to a touch-sensing-enabled display panel. In particular, the present invention relates to such display panel using anode electrodes of a passive matrix organic light emitting diode (PMOLED) array as in-cell touch sensors.

BACKGROUND

The general approach of adding touch-sensing capability to an organic light emitting diode (OLED) display panel is to supplement a transparent touch sensor layer, typically made from indium tin oxide (ITO) on top of the OLED display panel. There are several possible implementations for embedding the touch sensor layer into an OLED panel.

Figure 1:
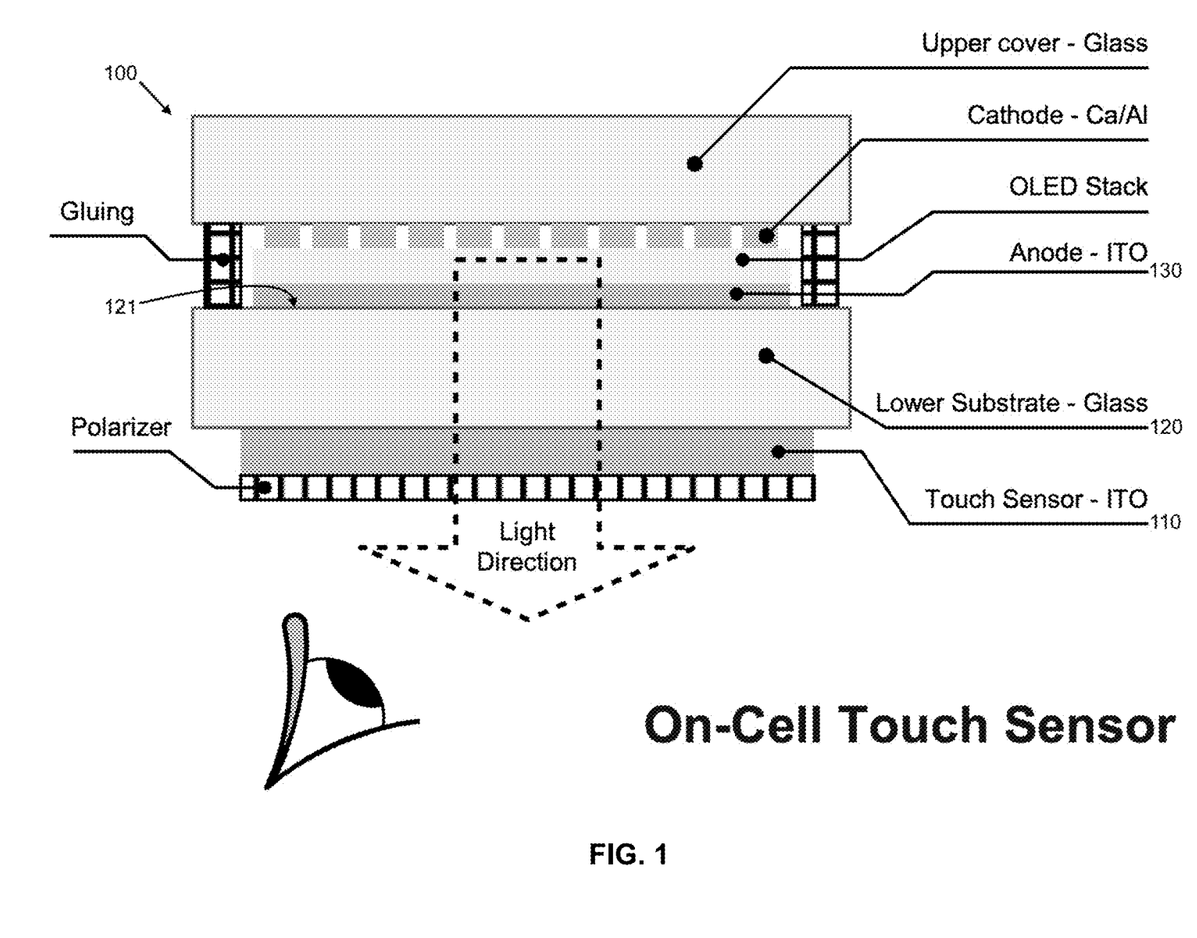
FIG. 1 depicts an on-cell touch sensor arrangement for an OLED panel.

FIG. 1 shows an on-cell touch sensor arrangement, where a touch sensor 110, in the form of a transparent conductive layer, is put on top of a substrate glass in an OLED panel 100. The on-cell touch sensor arrangement has the touch sensor 110 isolated from anode electrodes 130 by a thick layer of lower substrate glass 120 (normally, 0.4~0.7 mm). Hence, the capacitive coupling between the anode electrodes 130 and the touch sensors 110 is relatively low. This relatively low coupling is ideal for the touch sensor 110 to sense an approaching finger. On the other hand, a display driver for driving the OLED panel 100 is located on an inner side 121 of the substrate glass 120. Such arrangement is called a chip on glass (COG) arrangement. A touch controller for sensing a signal from the touch sensor 110 needs to communicate with the display driver as well as to connect to the touch sensor 110. Hence, a chip on film (COF) arrangement to bridge the touch sensor 110 with the touch controller is required.

Figure 2:
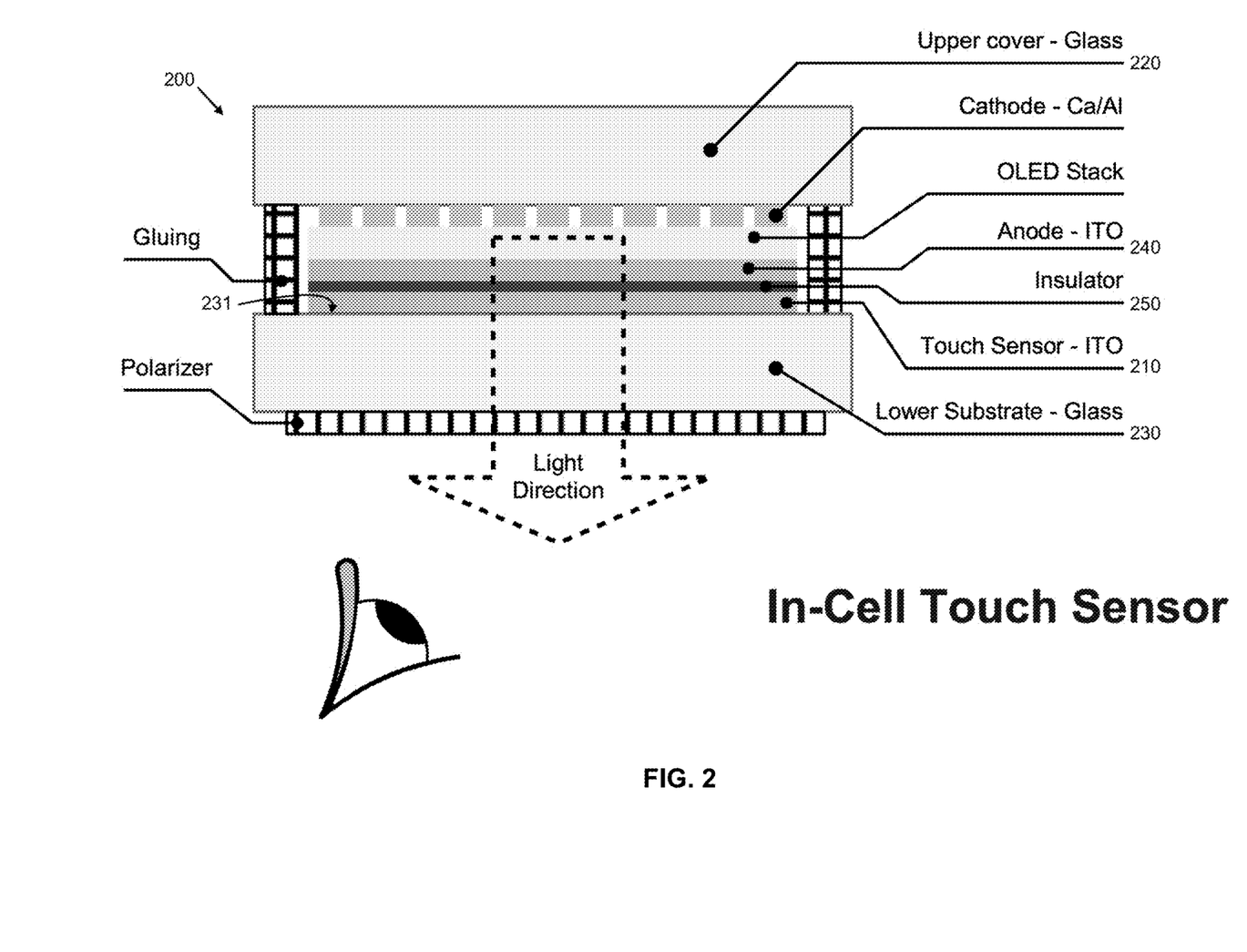
FIG. 2 depicts an in-cell touch sensor arrangement, which is an alternative arrangement to the on-cell touch sensor arrangement, for an OLED panel.

FIG. 2 shows an in-cell touch sensor arrangement, where a touch sensor 210, in the form of a transparent conductive layer, is put between an upper cover glass 220 and a lower substrate glass 230 in an OLED panel 200. The touch sensor 210 is isolated from anode electrodes 240 by a very thin layer of insulator 250 (~0.5 µm). Hence, the capacitive coupling between the anode electrodes 240 and the touch sensor 210 is high. This parasitic capacitance is much greater than an induced capacitance coming from an approaching finger, lowering the sensing sensitivity and limiting the dynamic range of the touch sensor 210. On the other hand, the integration of the display driver and the touch controller, both functioning on the same integrated circuit (IC), is feasible since the IC, the touch sensor 210 and the anode electrodes 240 are all located on an inner side 231 of the lower substrate glass 230.

Figure 3:
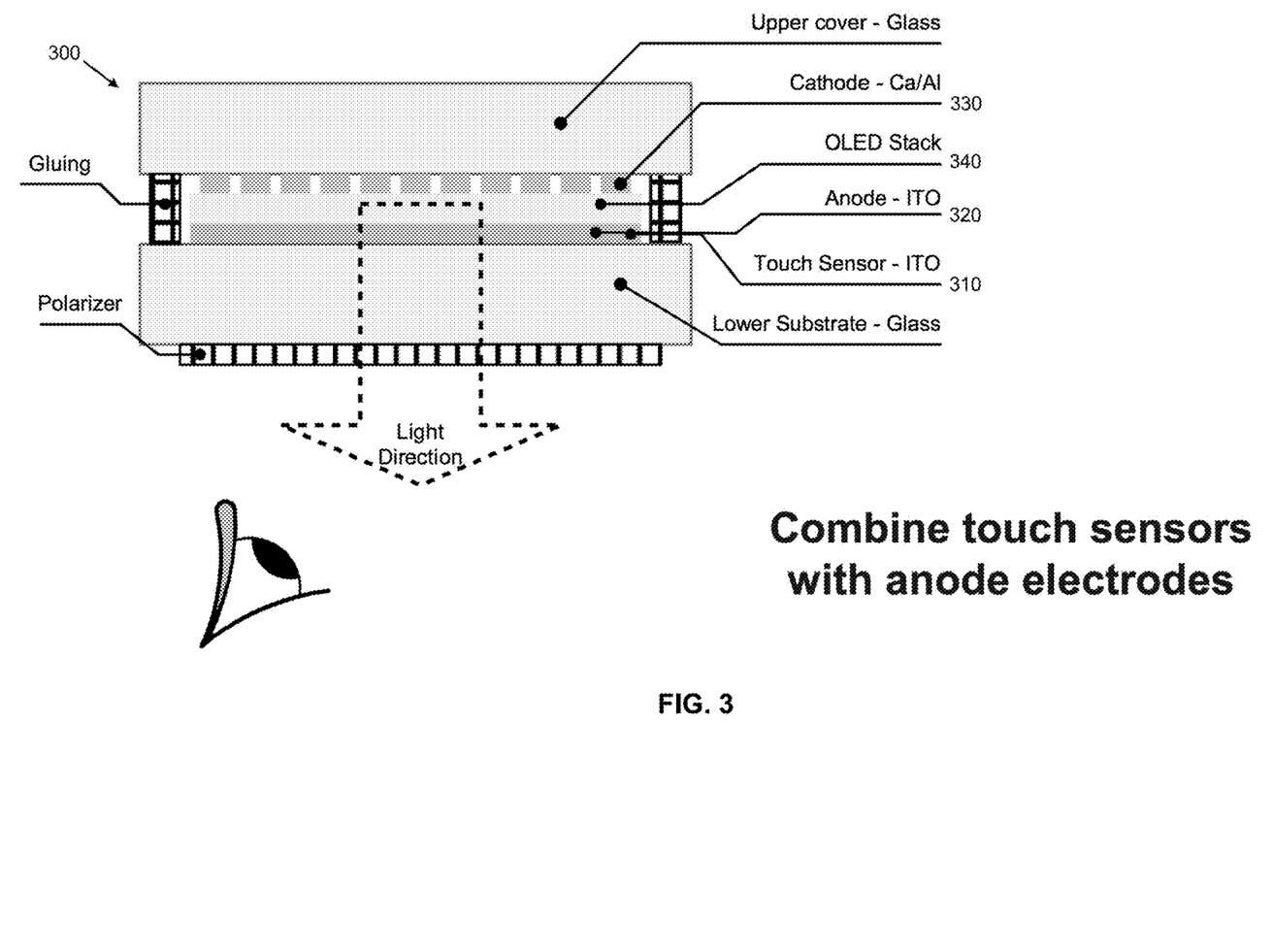
FIG. 3 depicts an arrangement obtained from simplifying the in-cell touch sensor arrangement.

FIG. 3 depicts another approach simplified from the in-cell touch sensor arrangement of FIG. 2. In an OLED panel 300, anode electrodes 320 are also used as touch sensors 310. In this arrangement, display driving and touch sensing are done in time multiplexing manner. That is, at a time instant, the OLED panel 300 is either in a display driving mode or in a touch sensing mode but not both. In a typical application, the display driving mode takes up about 90% of the time while touch sensing takes up around 10% of the time only. For a PMOLED array, the frame refresh rate is usually around 100 Hz. Similar to the in-cell touch arrangement, the anode electrodes 320 and cathode electrodes 330, both in layer forms, are in close proximity of each other. Since the OLED stack layer 340 is only about 1 µm thick, the capacitive coupling between the anode 320 and the cathode 330 is still quite high. This parasitic capacitance is much greater than the induced capacitance coming from an approaching finger. Also similar to the in-cell touch arrangement, the display driver and touch controller integration is feasible and, in fact, simpler than the integration used for the in-cell sensor arrangement. However, one drawback of this simplified approach is that the unidirectional and fixed form factor nature of the anode electrodes limits the touch sensor grid to one dimension only. For applications requiring two dimensional sensing, the shared anode electrode-sensor arrangement is not feasible.

The resolution of display screen increases drastically in recent times, and consequently the number of anode electrode increases. Obviously, the touch sensing resolution for the majority of applications that are designed for finger touch sensing needs not be as high as that of the display resolution. To save cost and space, multiple anode electrodes are grouped and shorted together for touch sensing operations. Touch detection is then determined based on comparison of the aggregated or summed sense signals from the anode electrode groups. Conventionally, the anode electrodes groupings are fixed during manufacturing. This, however, poses significant challenges when a touch falls on the border of an anode electrode group, overlaps two anode electrode groups, or moves across multiple anode electrode group in a sliding or transitional movement as the aggregated or summed sense signals from the anode electrode groups suffer low signal-to-noise (SNR) ratio and false detections. Therefore, there is an unmet need to increase the touch sensing sensitivity and accuracy of the simplified in-cell touch sensor arrangement of FIG. 3 while maintaining the simplicity in integrating the display driver and the touch controller.

SUMMARY OF THE INVENTION

The present invention provides a touch-sensing-enabled display module comprising at least a display panel. The display panel comprises an electroluminescent layer sandwiched between a first plurality of electrodes and a second plurality of electrodes. The second plurality of electrodes is used for transmitting touch-sensing signals induced at the display panel. Preferably, the electroluminescent layer is substantially composed of an organic material such that the electroluminescent layer and the first and second pluralities of electrodes collectively form a passive matrix organic light emitting diode (PMOLED) array. In the PMOLED array, the second plurality of electrodes may be a set of anode electrodes, and the first plurality of electrodes may be a set of cathode electrodes.

The display module further comprises a multiplexing and summing network (MSN) for performing multiplexing and summing on the touch-sensing signals received from the second plurality of electrodes to produce one or more output-channel signals for touch sensing. In particular, the multiplexing and the summing are reconfigurable such that the touch-sensing signals are dynamically selected for summing to produce various combinations of output-channel signals. The reconfigure-ability of the multiplexing and the summing enables implementation of touch sensing adaptive to graphical user interface (GUI).

In the display module, a touch controller is used for measuring the output-channel signals to generate touch sensing data. The display module further comprises a display driver for driving the first and second pluralities of electrodes so as to selectively excite the electroluminescent layer at different locations thereon. In addition to bridging the second plurality of electrodes to the touch controller, the MSN is further configured to bridge the second plurality of electrodes to the display driver such that the display driver and the touch controller individually access the second plurality of electrodes in a time-multiplexing manner.

A computing device is obtainable by including any embodiment of the display module, and a processor communicable with the display driver, the touch controller and the MSN. The processor is configured to analyze the touch data, to determine a new user interface (UI), to generate the new UI bitmap for the display driver and to reconfigure the MSN according to the new UI.

Other aspects of the present invention are disclosed as illustrated by the embodiments hereinafter.

BRIEF DESCRIPTION OF THE DRAWINGS

Embodiments of the invention are described in more detail hereinafter with reference to the drawings, in which.

DETAILED DESCRIPTION

As used herein, a computing device means an electronic device having at least computer processing capability and a touch-sensing-enabled display for interacting with a user of the computing device. Examples of the computing device include a smartphone, a smart watch, a tablet computer, a digital camera having a touch-sensing-enabled display for interacting with a photographer, and any consumer-electronic device having such touch-sensing-enabled display for user interaction. It is also possible that the computing device is one part of a larger computing equipment. For example, a user-interface electronic module in the aforementioned digital camera is deemed to be a computing device if the module includes a touch-sensing-enabled display and a processor for controlling the display.

In the following description, systems and methods of reconfigurable touch sensing for touch-display panel are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

In the present invention, the simplified in-cell touch sensor arrangement is used for a touch-sensing-enabled display module. Although the present invention is particularly useful when the display module is realized by a PMOLED array, the present invention is not limited only to PMOLED. The present invention is applicable to any LED-based panels realized by any electroluminescent material, organic or inorganic. Nevertheless, the present invention is hereinafter illustrated with reference to PMOLED array formed therefrom. Furthermore, in the description hereinafter for illustrating the present invention, anode electrodes in OLED panel are used as touch sensors. Those skilled in the art will appreciate that cathode electrodes can also be used as touch sensors without departing from the spirit of the present invention. The present invention is applicable regardless of whether anode electrodes or cathode electrodes are chosen as the touch sensors.

In accordance to various embodiments of the present invention, anode electrodes of a PMOLED array are used as in-cell touch sensors. Display driving and touch sensing operate in a time multiplexing manner. As will be shown, the present invention unveils several methods of dynamically grouping the anode electrodes such that the touch sensors are configurable in real-time. It allows the touch sensors to adaptively change or reshaped/resized according to an application run on a computing device. That is, the touch sensors of a display panel change adaptively to a UI shown on the display panel. Advantages of enabling the touch sensors to be configurable as provided by the present invention in comparison to a traditional simplified in-cell touch sensor arrangement are three-fold. First, an additional touch sensor layer is not needed. Second, utilization of the touch sensors is better. Third and of particular importance, signal-to-noise ratios (SNRs) of touch-sensing signals generated by the touch sensors are improved.

Figure 4:
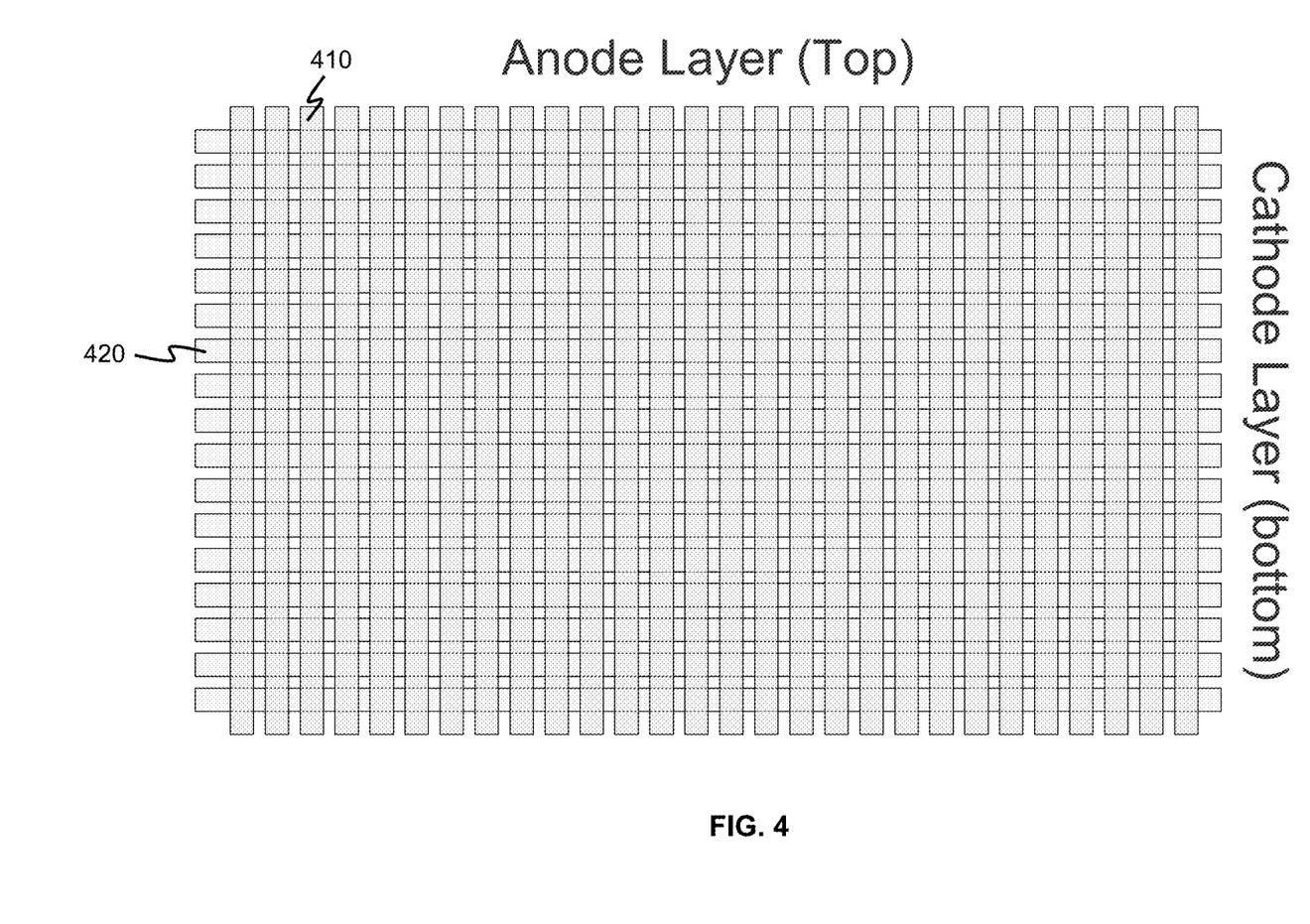
FIG. 4 depicts a general PMOLED layout arrangement as an example for illustration.

To illustrate the present invention, first consider a general PMOLED layout arrangement as shown in FIG. 4. A lower layer has cathode electrodes 420 running horizontally, while an upper layer has anode electrodes 410 running vertically. The OLED material (not shown) is sandwiched between the layer of cathode electrodes 420 and the layer of anode electrodes 410. One side of the OLED material contacts the cathode electrodes 420 and the other side of the material is attached to the anode electrodes 410. In the figures referenced hereinafter, only the layer of anode electrodes is shown for clarity.

Details of the present invention and the advantages thereof are hereinafter illustrated through applications of the present invention under different scenarios.

Figure 5:
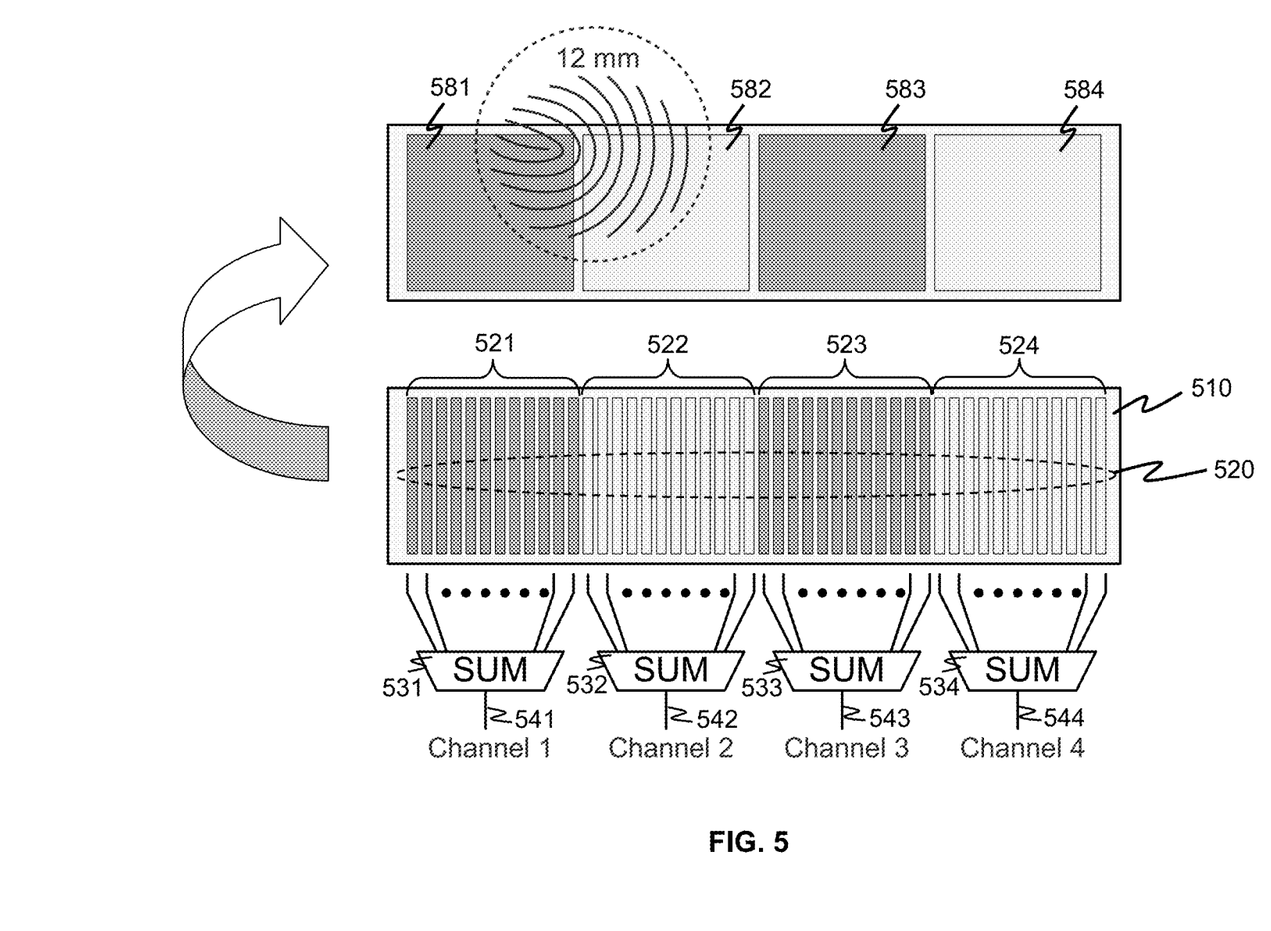
FIG. 5 depicts a first application of configuring or grouping anode electrodes for a display panel, where the display panel is used for receiving touch inputs from a finger of size 12 mm.
Figure 6:
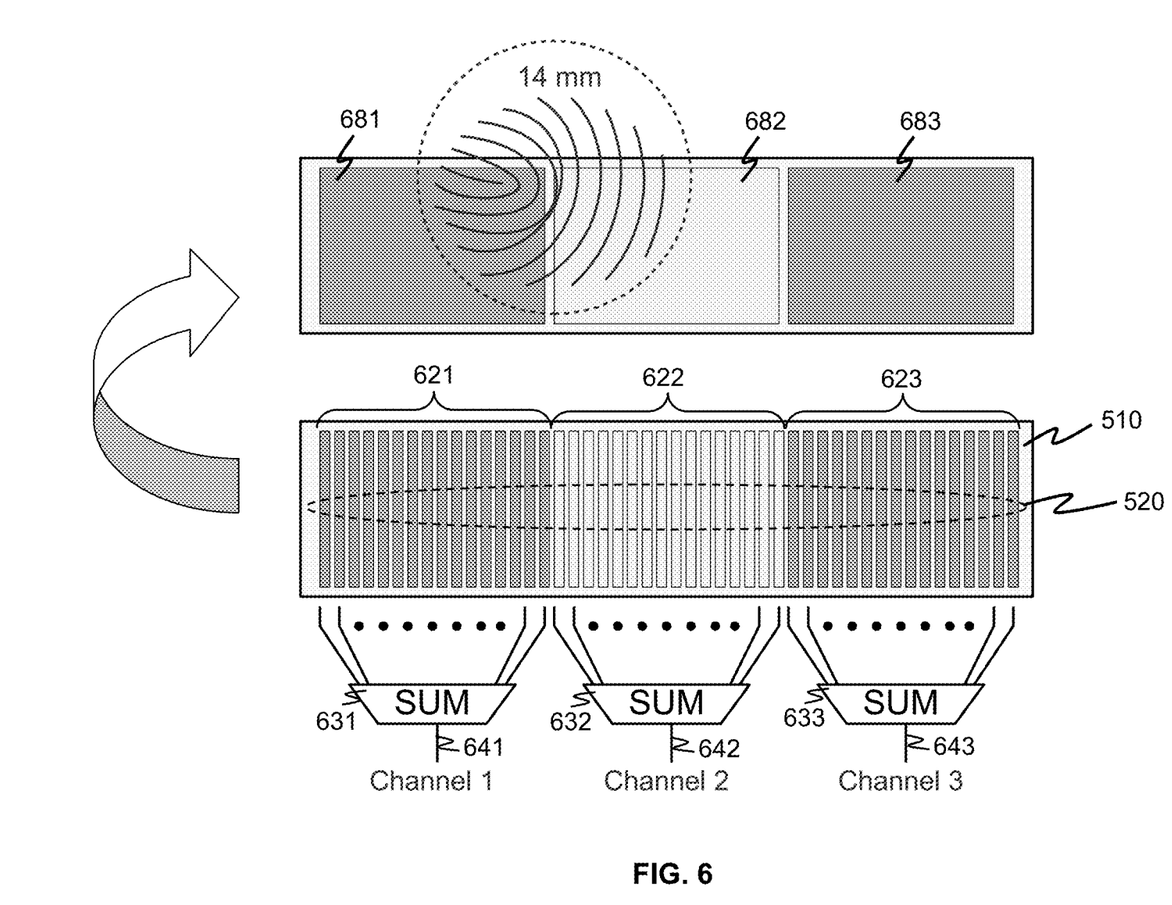
FIG. 6 depicts a second application of configuring or grouping anode electrodes for a display panel, where the display panel is used for receiving touch inputs from a finger of size 14 mm.

FIGS. 5 and 6 depict an application of configuring or grouping anode electrodes respectively under different finger-tip sizes of 12 mm and 14 mm, respectively. In both FIGS. 5 and 6, a display panel 510 having a plurality of anode electrodes 520 is used. Consider FIG. 5. During a touch sensing period, the anode electrodes 520 are grouped. In an individual group, the anode electrodes 520 are shorted together to form a bigger electrode so as to give a channel output that yields a greater SNR. After considering that the finger tip has a size of 12 mm, an application programmer may decide that it is desirable to use a UI to interface with a user where the UI is formed by dividing the display panel 510 into four touch sensors 581-584. Thus, the anode electrodes 520 are partitioned into four groups 521-524. Anode electrodes in each of the four groups 521-524 are shorted together to form one channel output. Shorting of electrodes is equivalent to a summing operation on the signals received through these electrodes, so that a summer is used. Four summers 531-534 are used for shorting the four groups 521-524 of anode electrodes, resulting in four channel outputs 541-544, each corresponding to a signal output obtained by one of the four touch sensors 581-584. Now turn to FIG. 6. The same display panel 510 is used. As the finger tip has a new size of 14 mm, the grouping of the anode electrodes 520 can be re-configured for three groups 621-623 being sufficient, yielding three touch sensors 681-683. Three summers 631-633 are respectively used to short anode electrodes in the three groups 621-623, resulting in three channel outputs 641-643 each corresponding to a signal output obtained by one of the three touch sensors 681-683.

Figure 7:
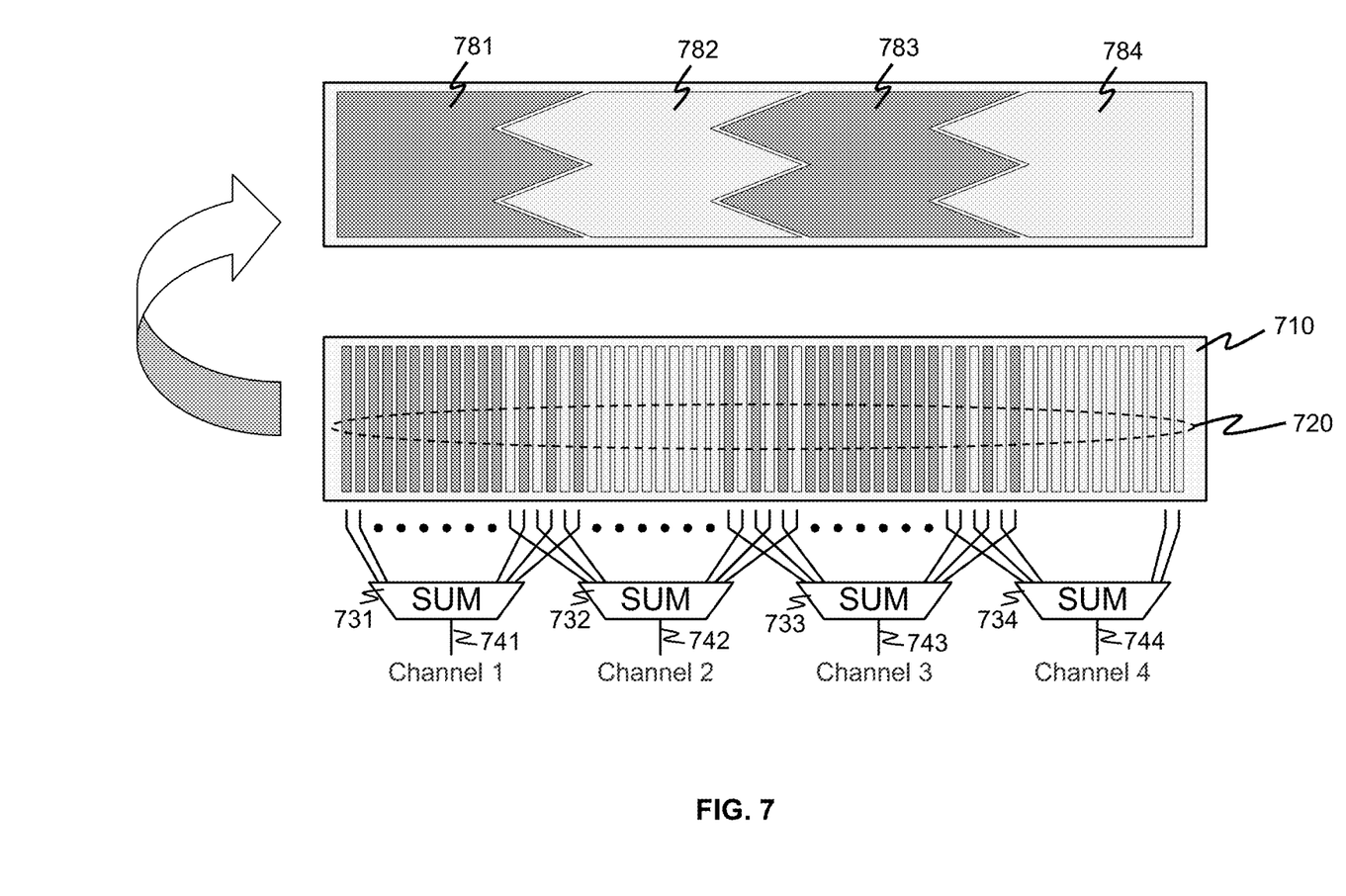
FIG. 7 depicts a third application of configuring or grouping anode electrodes for a display panel, where irregularly-shaped touch sensors are implemented on the display panel to correspond to a slide-bar UI.

In some applications utilizing analog style input interfaces, such as a slide bar (for e.g. volume control and dimming control). The sliding touch motion can be more smoothly captured with a touch screen having smooth (i.e. non-abrupt) transition from one sensor region to another. A reconfigurable grouping of anode electrodes can realize this effect, as shown in FIG. 7. A display panel 710 having anode electrodes 720 is configured to have four touch sensors 781-784. Note that the touch sensors have irregular shapes that are not rectangular. In particular, the boundary separating two adjacent touch sensors (e.g., the first sensor 781 and the second sensor 782) is of zig-zag shape in order to anticipate a continuous touch detection transitioning between the two sensors 781, 782. That is, the signal obtained from the first sensor 781 does not completely vanish before the signal of the second sensor 782 appears. To realize the smooth transition effect, the anode electrodes 720 are divided into four groups such that adjacent two groups share an overlapping region where anode electrodes in the overlapping region are distributed between the two groups such that on the average, the shapes of the corresponding two touch sensors (e.g., the two sensors 781, 782) are realized. Anode electrodes in the four groups are shorted respectively by four summers 731-734, producing four channel outputs 741-744.

Figure 8:
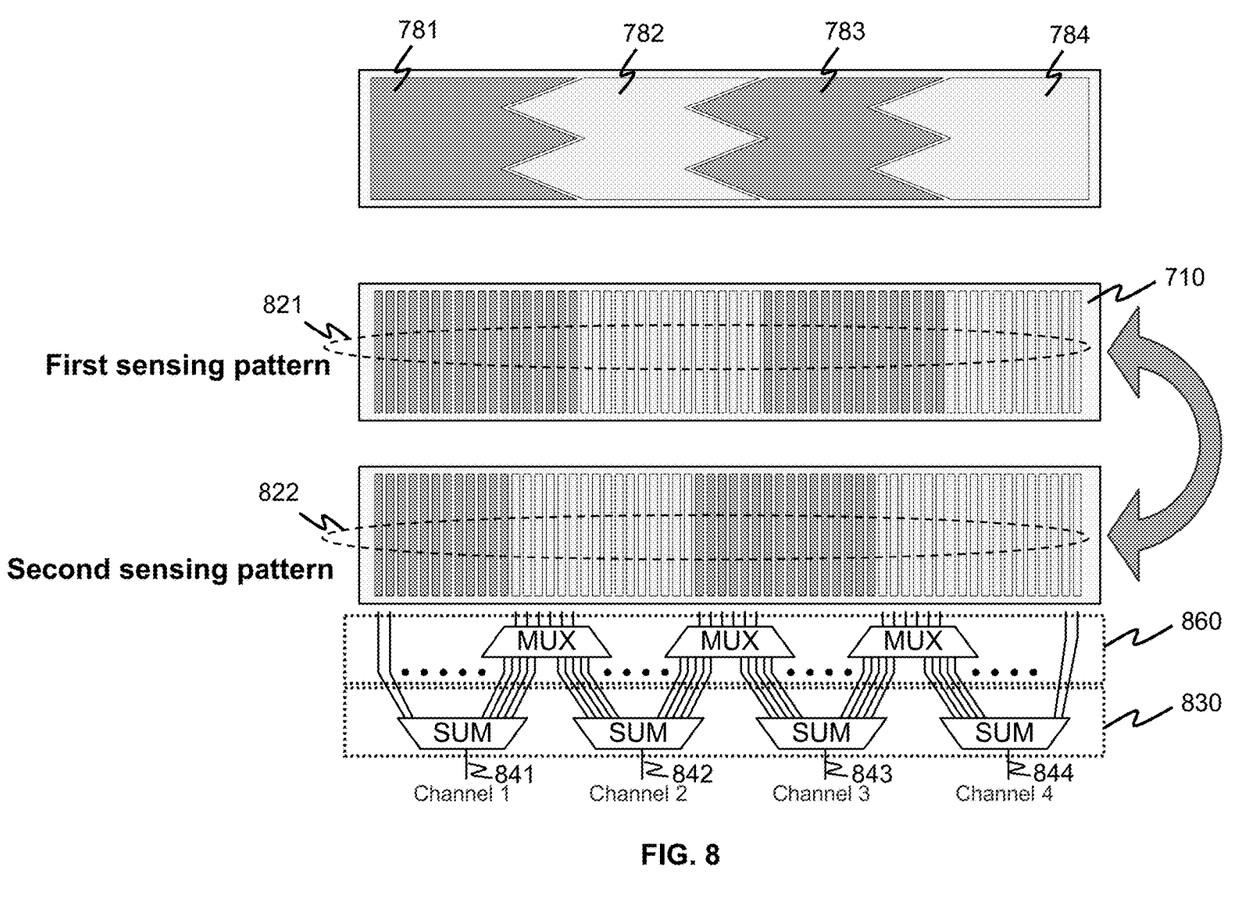
FIG. 8 depicts a fourth application of configuring or grouping anode electrodes for a display panel, where irregularly-shaped touch sensors are implemented on the display panel by a scheme different from the one shown in FIG. 7.

FIG. 8 depicts another scheme of realizing the irregularly-shaped touch sensors 781-784 corresponding to a slide-bar UI in the display panel 710. This scheme is different from the one shown in FIG. 7. Capacitive touch sensing is an operation requiring multiple samples and aggregating these samples to form a final result. Hence, two sensing patterns 821, 822 that slightly offset from each other can be used alternately. The aggregation of multiple samples produces a transition effect between adjacent touch sensors. The selection of which one of the two sensing patterns 821, 822 at different time instants is realized by using multiplexers 860. Outputs from the multiplexers 860 are processed by summers 830 to produce channel outputs 841-844.

By means of grouping anode electrodes, reconfiguration of touch sensors is obtainable. Adaptive sensor reconfiguration provides many possibilities in improving user experience in running user applications.

Figure 9:
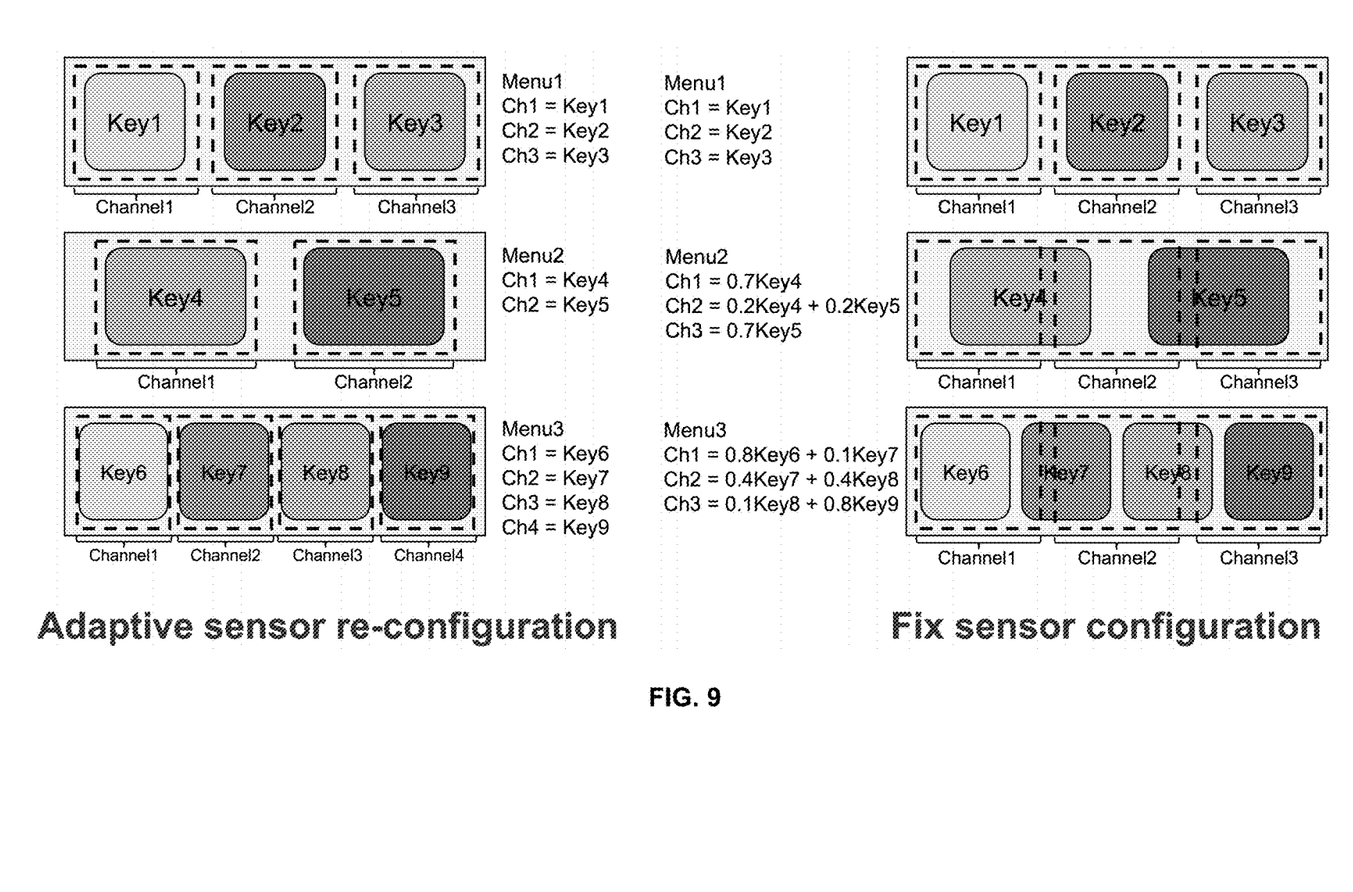
FIG. 9 is an example showing the first advantage of adaptive sensor reconfiguration, where touch sensors are adaptively fit to the sizes of buttons or keys shown on a display panel.

First, the SNR of a touch signal is improved, increasing accuracy in touch detection. In one example shown in FIG. 9, adaptive sensor reconfiguration is used to resize touch sensors to adaptively fit to the sizes of "buttons" or "Keys" shown on the display panel. For the fixed sensor configuration in the traditional approach, it is estimated that there is 10% to 60% drop due to non-overlapping between the Keys and the touch sensors.

Figure 10:
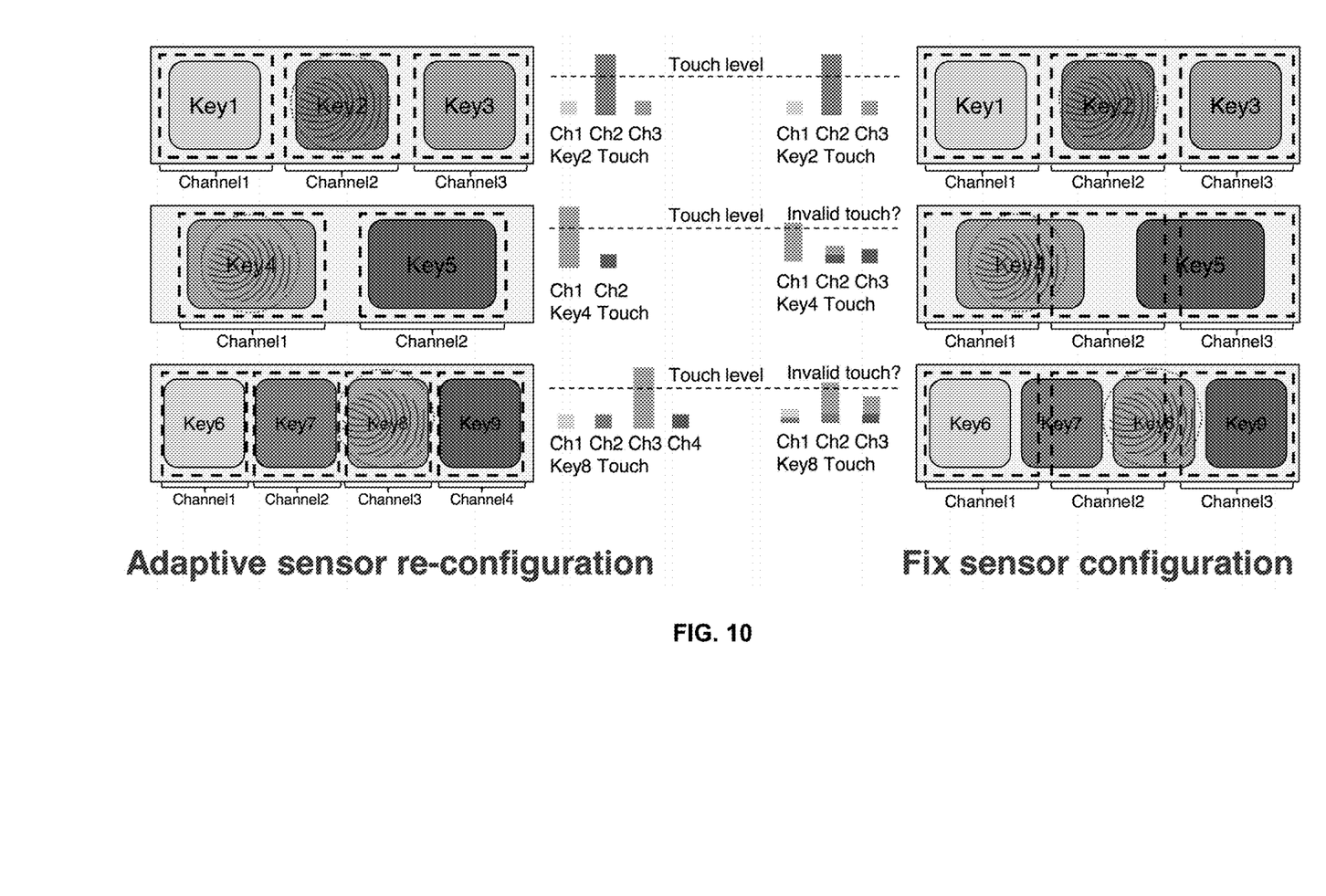
FIG. 10 is an example showing the second advantage of adaptive sensor reconfiguration, where a flexible touch UI design for user applications is supported by the adaptive sensor reconfiguration.

Second, reliable touch detection is achieved, as shown in an example depicted in FIG. 10. With a 100% sensor signal level utilization, unity threshold can be applied to all Key configurations while keeping a good margin for reliable touch sensing. In case of 4 Keys Menu, the fixed sensor configuration may fail to distinguish Key7 and Key8 touch. On the other hand, accurate detection of Key7 and Key8 is implementable by the adaptive sensor reconfiguration. A flexible touch UI design for user applications is supported by the adaptive sensor reconfiguration.

Figure 11:
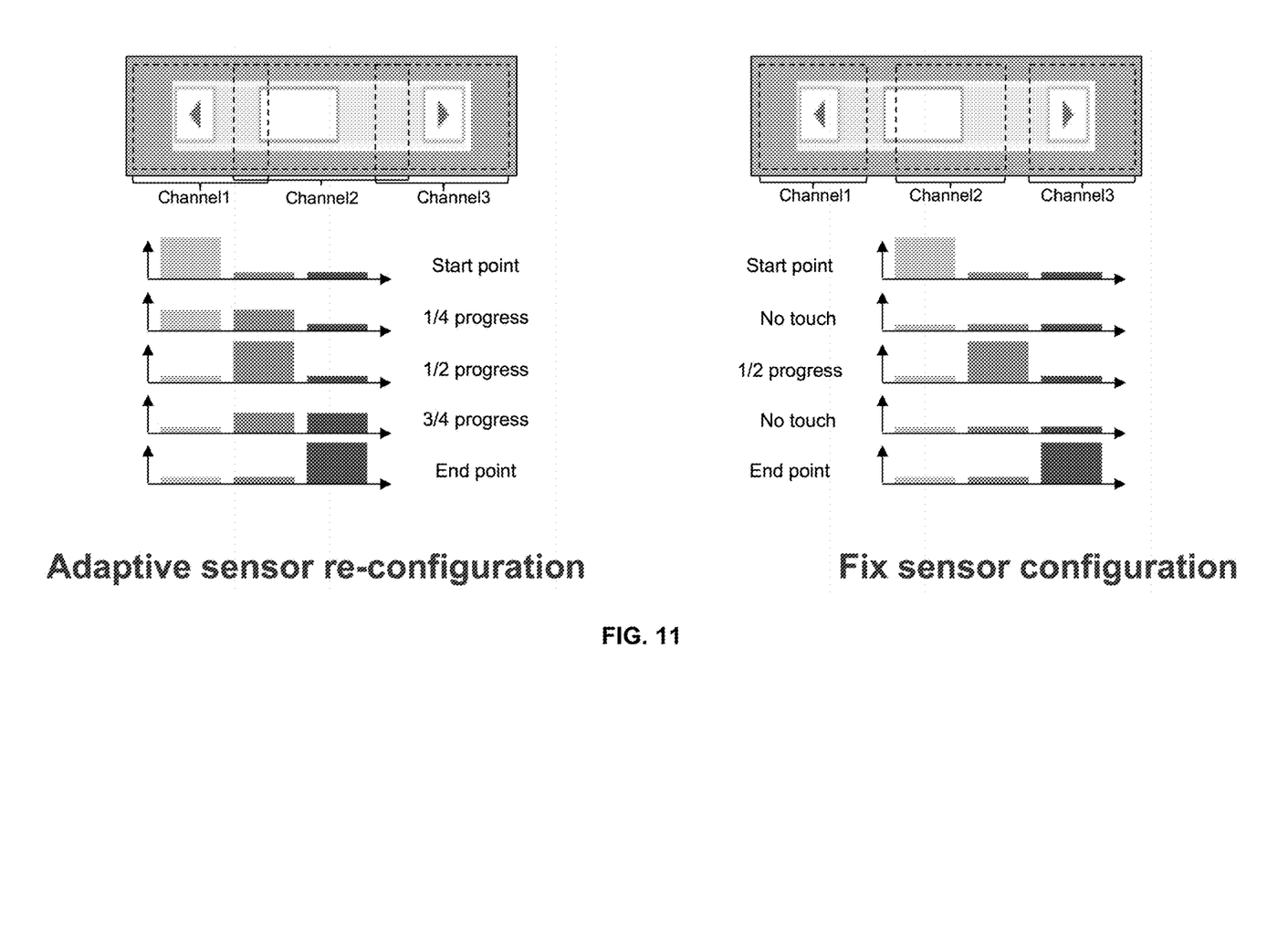
FIG. 11 is an example showing the third advantage of adaptive sensor reconfiguration, where dynamic changing of the sensor pattern to fit different nature of touch UI is made possible by the adaptive sensor reconfiguration.

Third, adaptive sensor reconfiguration provides smooth transition crossing two sensors, as shown in the example of FIG. 11. Adaptive sensor reconfiguration dynamically changes the sensor pattern to fit different nature of a touch UI. For example, in a slide-bar UI, progressive signal transition between adjacent sensors is guaranteed. Hence, no extra effort on tracking discrete touch state is required, leading to a side advantage of saving battery power.

Figure 12:
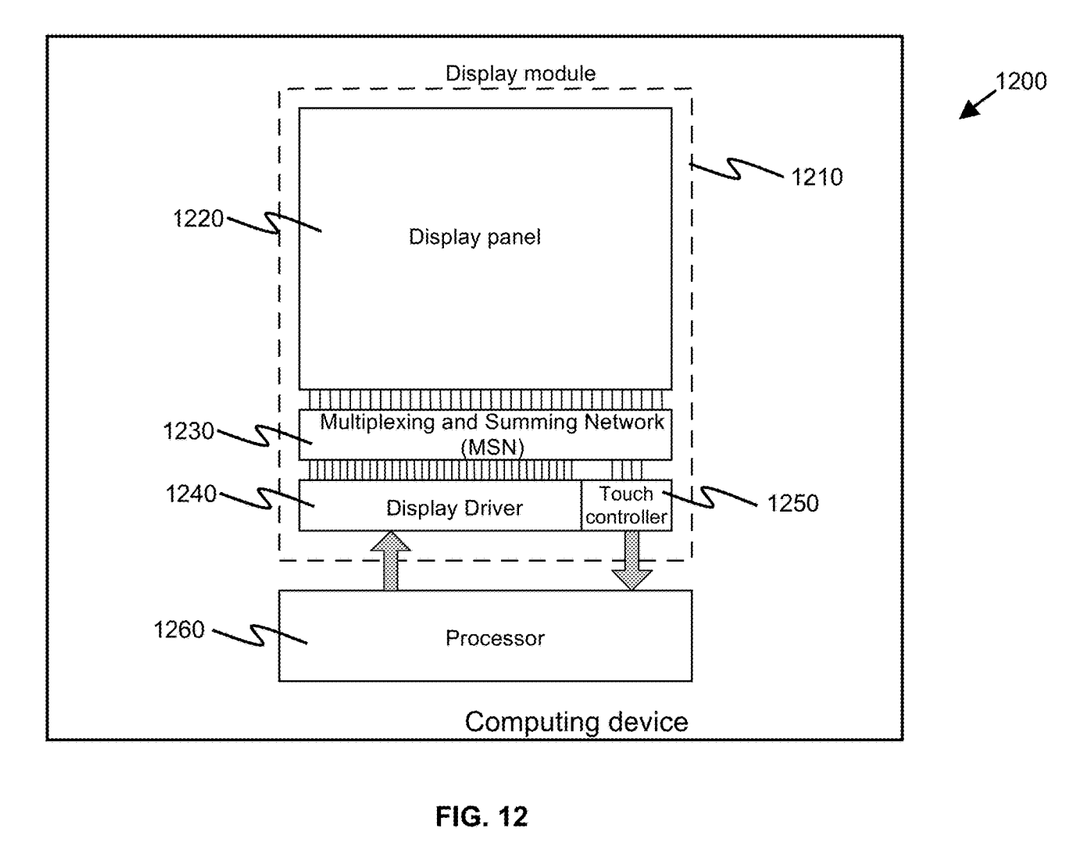
FIG. 12 exemplarily depicts a schematic diagram of a computing device comprising a touch-sensing-enabled display module that enables realization of adaptive sensor reconfiguration.

FIG. 12 exemplarily depicts a schematic diagram of a computing device 1200 comprising a touch-sensing-enabled display module 1210 that enables realization of adaptive sensor reconfiguration. The display module 1210 comprises a display panel 1220. Generally, the display panel 1220 comprises an electroluminescent layer sandwiched between a first plurality of electrodes and a second plurality of electrodes. The second plurality of electrodes is used for transmitting touch-sensing signals induced at the display panel 1220. As mentioned above, one practical option is that the electroluminescent layer is substantially composed of an organic material such that the electroluminescent layer and the first and second pluralities of electrodes collectively form a PMOLED array. In one practically-used arrangement, the first and second pluralities of electrodes are a set of cathode electrodes and a set of anode electrodes, respectively.

The display module 1210 further comprises a multiplexing and summing network (MSN) 1230 for performing multiplexing and summing on the touch-sensing signals received from the second plurality of electrodes to produce one or more output-channel signals (e.g. the channel outputs 541-544) for touch sensing. The multiplexing and the summing reflect the functions performed in configuring or grouping the second plurality of electrodes (see FIGS. 5-8). In particular, the multiplexing and the summing are reconfigurable such that the touch-sensing signals are dynamically selected for summing in order to produce one or more output-channel signals. From the discussion above regarding FIGS. 5-8, it is clear that the MSN 1230 is a main enabler in enabling adaptive sensor reconfiguration.

In the display module 1210, a touch controller 1250 is used for measuring the output-channel signals to generate touch data.

The display module 1210 further includes a display driver 1240 for driving the first and second pluralities of electrodes so as to selectively excite the electroluminescent layer at different locations thereon. In addition to bridging the second plurality of electrodes to the touch controller 1250, the MSN 1230 is further configured to bridge the second plurality of electrodes to the display driver 1240 such that the display driver 1240 and the touch controller 1250 individually access the second plurality of electrodes in a time-multiplexing manner.

Apart from having the display module 1210, the computing device 1200 further includes a processor 1260 configured to control the display driver 1240, the touch controller 1250 and the MSN 1230. To elaborate further, the processor 1260 is communicable with the display driver 1240, the touch controller 1250 and the MSN 1230, and is configured to analyze the touch data, to determine a new UI, to generate a new UI bitmap for the display driver 1240 and to reconfigure the MSN 1230 according to the new UI.

Figure 13:
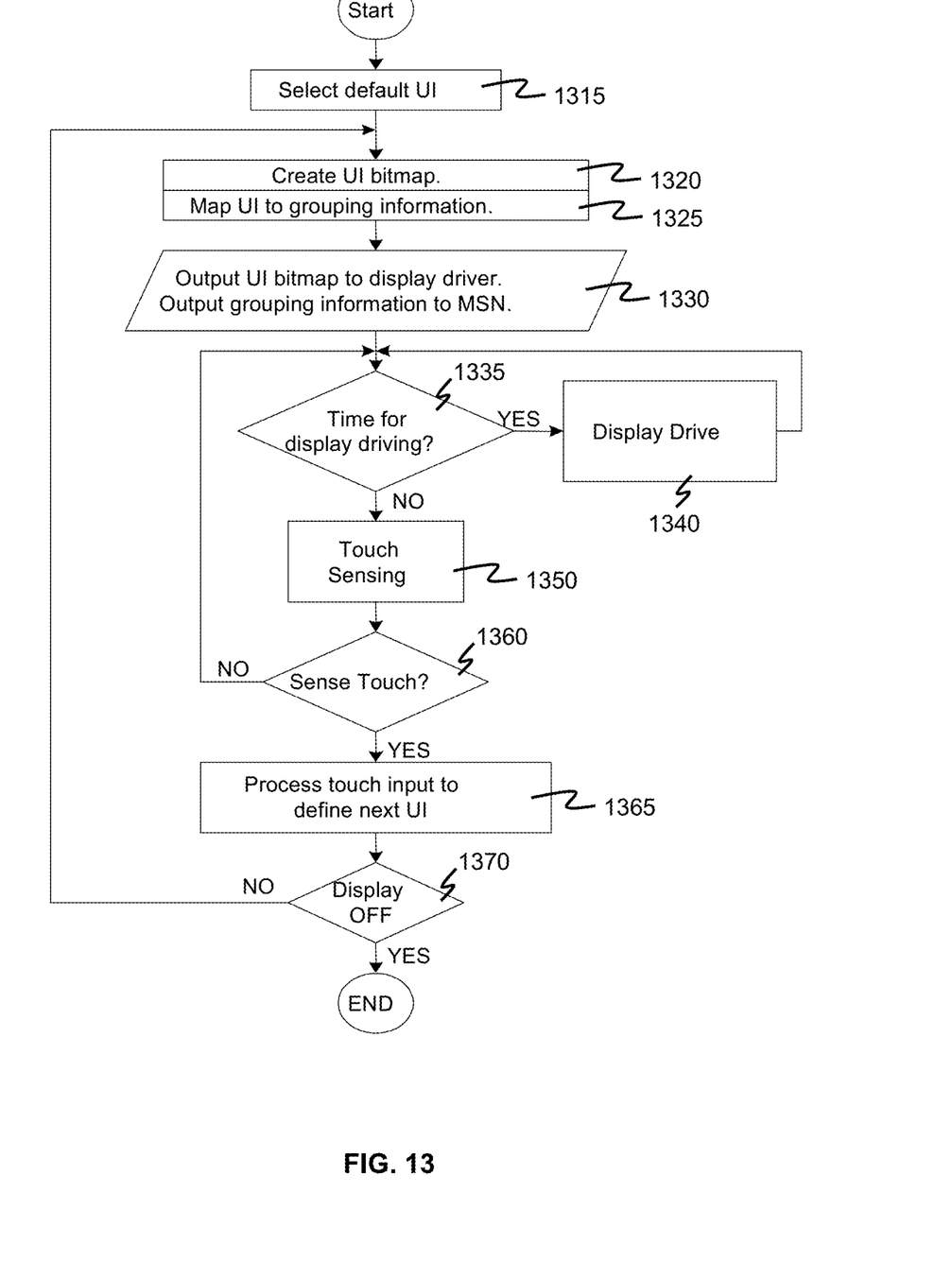
FIG. 13 depicts a flowchart for exemplarily illustrating realization of adaptive sensor reconfiguration.

FIG. 13 depicts a flowchart for exemplarily illustrating the steps for the processor 1260 of the computing device 1200 to interact a user through providing a UI realized with adaptive sensor reconfiguration.

In a step 1315, as an initial step, a default UI is selected. For example, the default UI may be a slide-bar UI or a UI comprising a menu of Keys. The selected default UI is to be used in a step 1320. In the step 1320, a UI bitmap is created based on a UI that is under consideration. If the step 1320 is executed after the step 1315, the UI under consideration is the selected default UI. After the step 1320 is performed, steps 1325 and 1330 are executed. In the step 1325, the UI under consideration is used to determine a scheme to group individual electrodes in the second plurality of electrodes. In the step 1330, the UI bitmap is sent to the display driver 1240 for display on the display panel 1220, and the grouping scheme is sent to the MSN 1230. In a step 1335, determine whether it is time for the display panel 1220 to display the UI. If it is determined in the step 1335 that it is time to display the UI, the processor 1260 commands the display driver 1240 to drive the display panel 1220 and the MSN 1230 to bridge the second plurality of electrodes with the display driver 1240 (step 1340). When the step 1340 is finished, the step 1335 is repeated. If it is determined in the step 1335 that it is not time to display the UI, touch sensing is performed (step 1350). In the step 1350, the processor 1260 configures the touch controller 1250 to perform touch sensing and hence produce the touch data. Also in the step 1350, the processor 1260 configures the MSN 1230 to bridge the second plurality of electrodes with the touch controller 1250. After the touch data are obtained in the step 1350, the processor 1260 checks if a touch has been made on the display panel 1220 from the obtained touch data (step 1360). If not, then the step 1335 is repeated. If yes, then a step 1365 is performed. In the step 1365, a touch input is determined from the obtained touch data, and the touch input is further processed to define a next UI to be displayed on the display panel 1220. After the step 1365 is completed, the processor determines if the display panel 1220 is to be switched off (step 1370). If not, then the step 1320 is repeated, where the UI under consideration is the aforementioned next UI to be displayed.

The embodiments disclosed herein may be implemented using a general purpose or specialized computing device, computer processor, or electronic circuitry including but not limited to a digital signal processor (DSP), application specific integrated circuit (ASIC), a field programmable gate array (FPGA), and other programmable logic device configured or programmed according to the teachings of the present disclosure. Computer instructions or software codes running in the general purpose or specialized computing device, computer processor, or programmable logic device can readily be prepared by practitioners skilled in the software or electronic art based on the teachings of the present disclosure The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A computing device for interacting with a user, comprising:
   a touch-sensing-enabled display module, comprising:
      a display panel comprising an electroluminescent layer sandwiched between a first plurality of electrodes and a second plurality of electrodes, the second plurality of electrodes being used for transmitting touch-sensing signals induced at the display panel;
      a multiplexing and summing network (MSN) for performing multiplexing and summing on the touch-sensing signals received from the second plurality of electrodes to produce one or more output-channel signals for touch sensing, wherein the multiplexing and the summing are reconfigurable such that the touch-sensing signals are dynamically selected for summing to generate one or more output-channel signals;
      a touch controller for measuring the output-channel signals to generate touch data; and
      a display driver for driving the first and second pluralities of electrodes so as to selectively excite the electroluminescent layer at different locations thereon;
   and
   a processor communicable with the display driver, the touch controller and the MSN, wherein the processor is configured to analyze the touch data, to determine a new user interface (UI), to generate the new UI bitmap for the display driver and to reconfigure the MSN according to the new UI;
   wherein:

in addition to bridging the second plurality of electrodes to the touch controller, the MSN is further configured to bridge the second plurality of electrodes to the display driver such that the display driver and the touch controller individually access the second plurality of electrodes in a time-multiplexing manner.

2. The computing device of claim 1, wherein the electroluminescent layer is substantially composed of an organic material such that the electroluminescent layer and the first and second pluralities of electrodes collectively form a passive matrix organic light emitting diode (PMOLED) array.

3. The computing device of claim 2, wherein in the PMOLED array, the second plurality of electrodes is a set of anode electrodes, and the first plurality of electrodes is a set of cathode electrodes.

4. A computing device for interacting with a user, comprising:
   a touch-sensing-enabled display module, comprising:
      a display panel comprising an electroluminescent layer sandwiched between a first plurality of electrodes and a second plurality of electrodes, the second plurality of electrodes being used for transmitting touch-sensing signals induced at the display panel;
      a multiplexing and summing network (MSN) for performing multiplexing and summing on the touch-sensing signals received from the second plurality of electrodes to produce one or more output-channel signals for touch sensing, wherein the multiplexing and the summing are reconfigurable such that the touch-sensing signals are dynamically selected for summing to generate one or more output-channel signals;
      a touch controller for measuring the output-channel signals to generate touch data; and
      a display driver for driving the first and second pluralities of electrodes so as to selectively excite the electroluminescent layer at different locations thereon;
   and
   a processor configured to control the display driver, the touch controller and the MSN, wherein the processor is configured to recursively update the MSN configuration with a predefined set of configuration independent of any UI update or change;
wherein:
   in addition to bridging the second plurality of electrodes to the touch controller, the MSN is further configured to bridge the second plurality of electrodes to the display driver such that the display driver and the touch controller individually access the second plurality of electrodes in a time-multiplexing manner.

5. The computing device of claim 4, wherein the electroluminescent layer is substantially composed of an organic material such that the electroluminescent layer and the first and second pluralities of electrodes collectively form a passive matrix organic light emitting diode (PMOLED) array.

6. The computing device of claim 5, wherein in the PMOLED array, the second plurality of electrodes is a set of anode electrodes, and the first plurality of electrodes is a set of cathode electrodes.

7. A computing device for interacting with a user, comprising:
   a touch-sensing-enabled display module, comprising:
      a display panel comprising an electroluminescent layer sandwiched between a first plurality of electrodes and a second plurality of electrodes, the second plurality of electrodes being used for transmitting touch-sensing signals induced at the display panel;
      a multiplexing and summing network (MSN) for performing multiplexing and summing on the touch-sensing signals received from the second plurality of electrodes to produce one or more output-channel signals for touch sensing, wherein the multiplexing and the summing are reconfigurable such that the touch-sensing signals are dynamically selected for summing to generate one or more output-channel signals;
      a touch controller for measuring the output-channel signals to generate touch data; and
      a display driver for driving the first and second pluralities of electrodes so as to selectively excite the electroluminescent layer at different locations thereon;
   and
   a processor communicable with the display driver, the touch controller and the MSN, wherein the processor is configured to execute a process for interacting with the user through the display panel;
wherein in addition to bridging the second plurality of electrodes to the touch controller, the MSN is further configured to bridge the second plurality of electrodes to the display driver such that the display driver and the touch controller individually access the second plurality of electrodes in a time-multiplexing manner; and
   wherein the process comprises the steps of:
   (a) selecting a default UI as a UI to be considered in the step (b);
   (b) performing:
      creating a UI bitmap based on a UI that is considered;
      based on the UI, determining a scheme to group individual electrodes in the second plurality of electrodes;
      sending the grouping scheme to the MSN; and
      sending the UI bitmap to the display driver for display on the display panel;
   (c) determining whether it is time for the display panel to display the UI;
   (d) if it is determined in the step (c) that it is time for the display panel to display the UI, performing:
      configuring the display driver to drive the display panel and the MSN to bridge the second plurality of electrodes with the display driver; and
      executing the step (c);
   (e) if it is determined in the step (c) that it is not time for the display panel to display the UI, performing:
      configuring the MSN to bridge the second plurality of electrodes with the touch controller; and
      configuring the touch controller to perform touch sensing and hence produce the touch data;
   (f) after the touch data are obtained in the step (e), checking whether a touch has been made on the display panel from the obtained touch data;
   (g) if it is found in the step (f) that a touch has not been made, executing the step (c);
   (h) if it is found in the step (f) that a touch has been made, determining a touch input from the obtained touch data and processing the touch input to define a next UI to be displayed on the display panel;
   (i) after the step (h) is completed, determining if the display panel is to be switched off; and (j) if it is determined in the step (i) that the display panel is not to be switched off, executing the step (b) with the UI that is considered being the next UI.

8. The computing device of claim 7, wherein the electroluminescent layer is substantially composed of an organic material such that the electroluminescent layer and the first and second pluralities of electrodes collectively form a passive matrix organic light emitting diode (PMOLED) array.

9. The computing device of claim 8, wherein in the PMOLED array, the second plurality of electrodes is a set of anode electrodes, and the first plurality of electrodes is a set of cathode electrodes.

* * * * *